United States Patent
Kwon

(10) Patent No.: US 10,724,791 B2
(45) Date of Patent: Jul. 28, 2020

(54) REFRIGERATOR AND DISPLAY ASSEMBLY FOR REFRIGERATOR

(71) Applicant: LG ELECTRONICS INC., Seoul (KR)

(72) Inventor: Youl Kwon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 154 days.

(21) Appl. No.: 15/634,463

(22) Filed: Jun. 27, 2017

(65) Prior Publication Data

US 2018/0003428 A1    Jan. 4, 2018

(30) Foreign Application Priority Data

Jun. 30, 2016 (KR) ........................ 10-2016-0082965

(51) Int. Cl.
*F25D 29/00* (2006.01)
*F25C 5/20* (2018.01)
(Continued)

(52) U.S. Cl.
CPC .............. *F25D 29/005* (2013.01); *F25C 5/22* (2018.01); *F25D 11/00* (2013.01); *F25D 23/028* (2013.01);
(Continued)

(58) Field of Classification Search
None
See application file for complete search history.

(56) References Cited

U.S. PATENT DOCUMENTS

| 9,115,932 B2 | 8/2015 | McDaniel |
| 2006/0196214 A1 | 9/2006 | Lee et al. |

(Continued)

FOREIGN PATENT DOCUMENTS

| CN | 105588400 | 5/2016 |
| EP | 2447642 | 5/2012 |
| JP | 2013-057431 | 3/2013 |
| JP | 2013-068402 | 4/2013 |

(Continued)

OTHER PUBLICATIONS

Korean Office Action dated Jun. 20, 2017 issued in Application No. 10-2016-0082965.
European Search Report dated Oct. 6, 2017 issued in Application No. 17178301.2.
Chinese Office Action dated Jun. 5, 2019 issued in Application No. 201710500744.3 (English translation attached).

* cited by examiner

*Primary Examiner* — Ifedayo B Iluyomade
(74) *Attorney, Agent, or Firm* — Ked & Associates, LLP

(57) ABSTRACT

A refrigerator and a display for a refrigerator are provided. The display may include a display plate defining an outer appearance of a front surface of the display, a plurality of display portions that displays information of the refrigerator and is formed by an arrangement of a plurality of fine through-holes that pass through the display plate, a plurality of operational interfaces formed on a front surface of the display plate and operated by a touch input, a touch PCB provided on a rear surface of the display plate and including a plurality of touch sensors at positions corresponding to the plurality of operational interfaces, a display PCB on which a LED that radiates light toward the plurality of fine through-holes is mounted, and a display cover provided close to the rear surface of the display plate and on which the touch PCB and the display PCB are mounted.

20 Claims, 8 Drawing Sheets

(51) Int. Cl.
  *F25D 11/00*   (2006.01)
  *F25D 23/02*   (2006.01)
  *F25D 23/12*   (2006.01)
  *G06F 3/041*   (2006.01)
  *H05K 1/02*    (2006.01)
  *H05K 1/14*    (2006.01)
  *H05K 1/18*    (2006.01)
  *H05K 5/00*    (2006.01)
  *H05K 5/03*    (2006.01)

(52) U.S. Cl.
  CPC ......... *F25D 23/126* (2013.01); *G06F 3/0412* (2013.01); *H05K 1/0274* (2013.01); *H05K 1/14* (2013.01); *H05K 1/181* (2013.01); *H05K 5/0008* (2013.01); *H05K 5/0017* (2013.01); *H05K 5/03* (2013.01); *F25C 2400/10* (2013.01); *F25D 2400/361* (2013.01); *H05K 2201/10106* (2013.01); *H05K 2201/10151* (2013.01)

(56) References Cited

U.S. PATENT DOCUMENTS

| | | | |
|---|---|---|---|
| 2014/0239010 A1* | 8/2014 | Hwang | F25D 23/126 222/23 |
| 2016/0117022 A1 | 4/2016 | Kim et al. | |
| 2016/0131420 A1* | 5/2016 | Park | F25D 23/028 62/56 |

FOREIGN PATENT DOCUMENTS

| KR | 10-2011-0084789 | 7/2011 |
| KR | 10-2014-0121753 | 10/2014 |
| KR | 10-2015-0027180 | 3/2015 |

REFRIGERATOR AND DISPLAY ASSEMBLY FOR REFRIGERATOR

CROSS-REFERENCE TO RELATED APPLICATION

This application claims priority under 35 U.S.C. § 119 and 35 U.S.C. § 365 to Korean Patent Application No. 10-2016-0082965, filed on Jun. 30, 2016, whose entire disclosure is incorporated herein by reference.

BACKGROUND

1. Field

A refrigerator and a display assembly for a refrigerator are disclosed herein.

2. Background

A refrigerator is a household appliance that may store items at a low temperature in an internal storage space shielded by a door. The refrigerator may be configured to store the items in an optimal state by cooling the internal storage space using cooled air generated via heat exchange with a refrigerant circulating through a refrigeration cycle. Refrigerators have become increasingly large and multifunctional depending on trends such as changes in diet and products to be advanced, and refrigerators having various structures and convenience devices for user convenience and efficient use of internal space thereof have been released.

Storage spaces of the refrigerator may be opened and closed by a door. Refrigerators may be classified into various types according to a disposition of the storage space and a structure of the door for opening and closing the storage space. Refrigerators may be provided with a display assembly or display that displays, for example, an activation state of the refrigerator. The display assembly may display various kinds of information according to the activation of a household appliance in the form of numbers, letters, symbols, or pictures.

Korean Patent Laid-Open Publication No. 10-2014-0121753, which is hereby incorporated by reference, provides a refrigerator which may include a display unit on a rear surface of a metallic front surface plate of a refrigerator door and having a structure in which a display portion of the display unit may be observed by users through a plurality of through openings formed on a front surface plate. Korean Patent Laid-Open Publication 10-2014-0121753 also provides the display unit may be mounted on an upper cap by forming an accommodation space on the upper cap so as to mount the display unit and that an input portion for operating inputs by the user may be formed on a guide portion.

However, there are problems that a structure and shape of the upper cap may be changed for mounting the display unit, that the structure thereof may be complicated, and that components thereof may be increased. If the disposition between the front surface plate of the door and the display unit do not match each other, there may be problems in that the information may not be displayed clearly and the operation input by the user may not be input correctly. Intuitive operation may be difficult since portions and positions on which information is displayed by the input portion may not match each other.

The above references are incorporated by reference herein where appropriate for appropriate teachings of additional or alternative details, features and/or technical background.

BRIEF DESCRIPTION OF THE DRAWINGS

The embodiments will be described in detail with reference to the following drawings in which like reference numerals refer to like elements wherein.

DETAILED DESCRIPTION

A bottom freezing type of a refrigerator having a freezing chamber provided below a refrigerating chamber has been described for convenience of explanation and understanding of the present disclosure, but it is noted that the present disclosure is applicable to all types of refrigerators having a dispenser.

Figure 1:
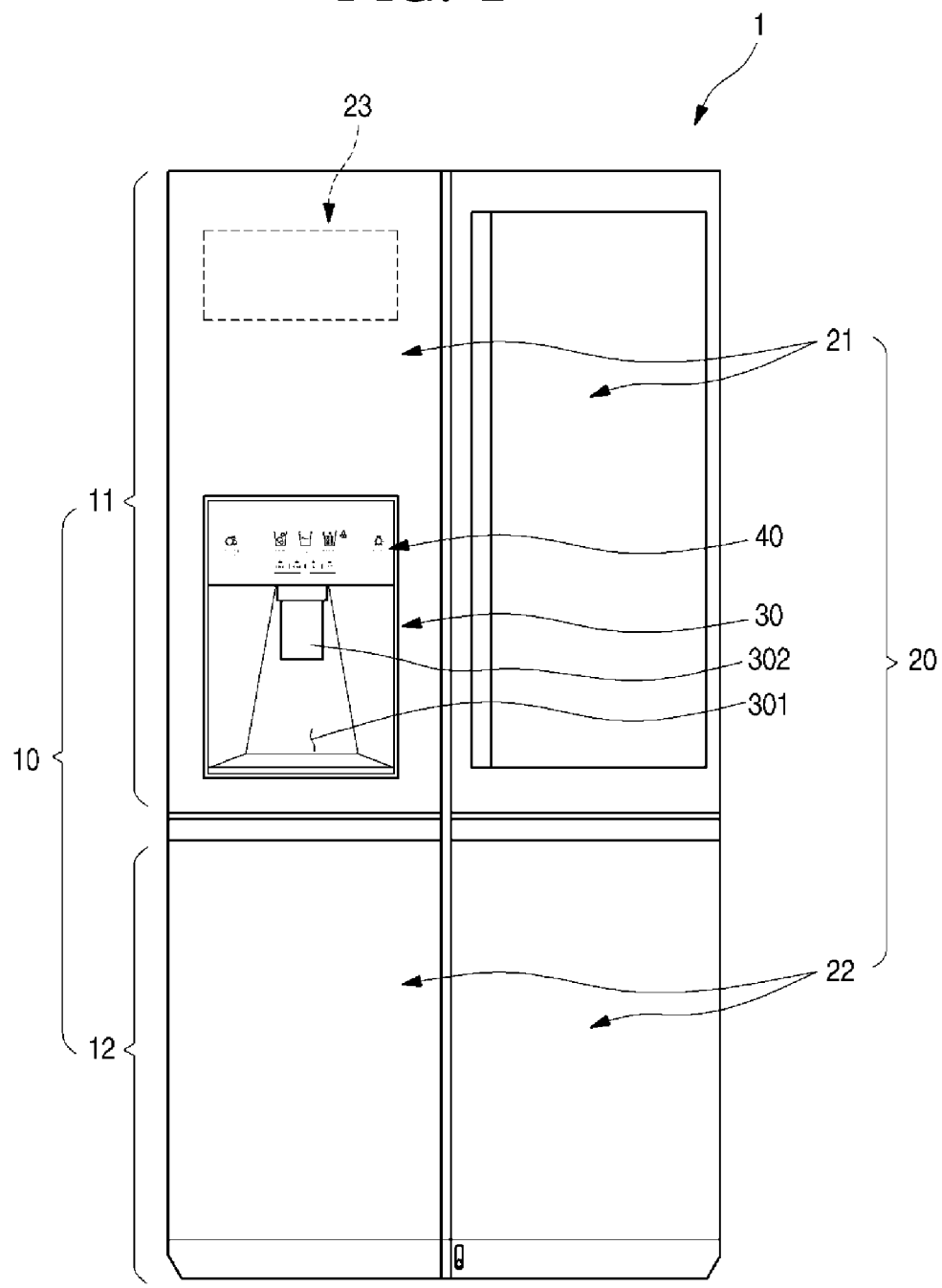
FIG. 1 is a front view of a refrigerator according to the present disclosure.

Referring to FIG. 1, a refrigerator 1 may have an outer appearance formed by a cabinet 10 that may form a storage space and a door 20 that may open and close the storage space. The storage space may be vertically partitioned by a barrier and the storage space inside the cabinet 10 may include an upper refrigerating chamber or first chamber 11 and a lower freezing chamber or second chamber 12. The door 20 may include a refrigerating chamber door or first door 21 and a freezing chamber door or second door 22 to open and close the refrigerating chamber 11 and the freezing chamber 12, respectively. The refrigerating chamber door 21 and the freezing chamber door 22 may be rotatably mounted on the cabinet 10, and a pair of doors may be provided on both sides thereof. Thus, a front surface of the refrigerating chamber 11 or the freezing chamber 12 may be configured to be selectively opened and closed by the pair of doors.

An ice maker 23 and a dispenser 30 may be provided on the refrigerating chamber door 21 on one side of the pair of refrigerating chamber doors 21. The ice maker 23 may be configured to make and store ice. The dispenser 30 may dispense ice made by the ice maker 23 or water. The dispenser 30 may include a depressed portion 301 that forms a space to dispense water or ice, and a display assembly or module 40 may be provided above the depressed portion 301 and may display an activation state of the refrigerator 1 and operate the refrigerator 1.

A lever 302 may be provided inside the depressed portion 301. The lever 302 may be configured to dispense ice or water out of the dispenser 30 and a port 303 to dispense water or ice may be positioned above the lever 302. When a user positions an object such as a container in the depressed portion 301 and pushes or operates the lever 302, water or ice may be dispensed out from the port 303 to the object.

Figure 2:
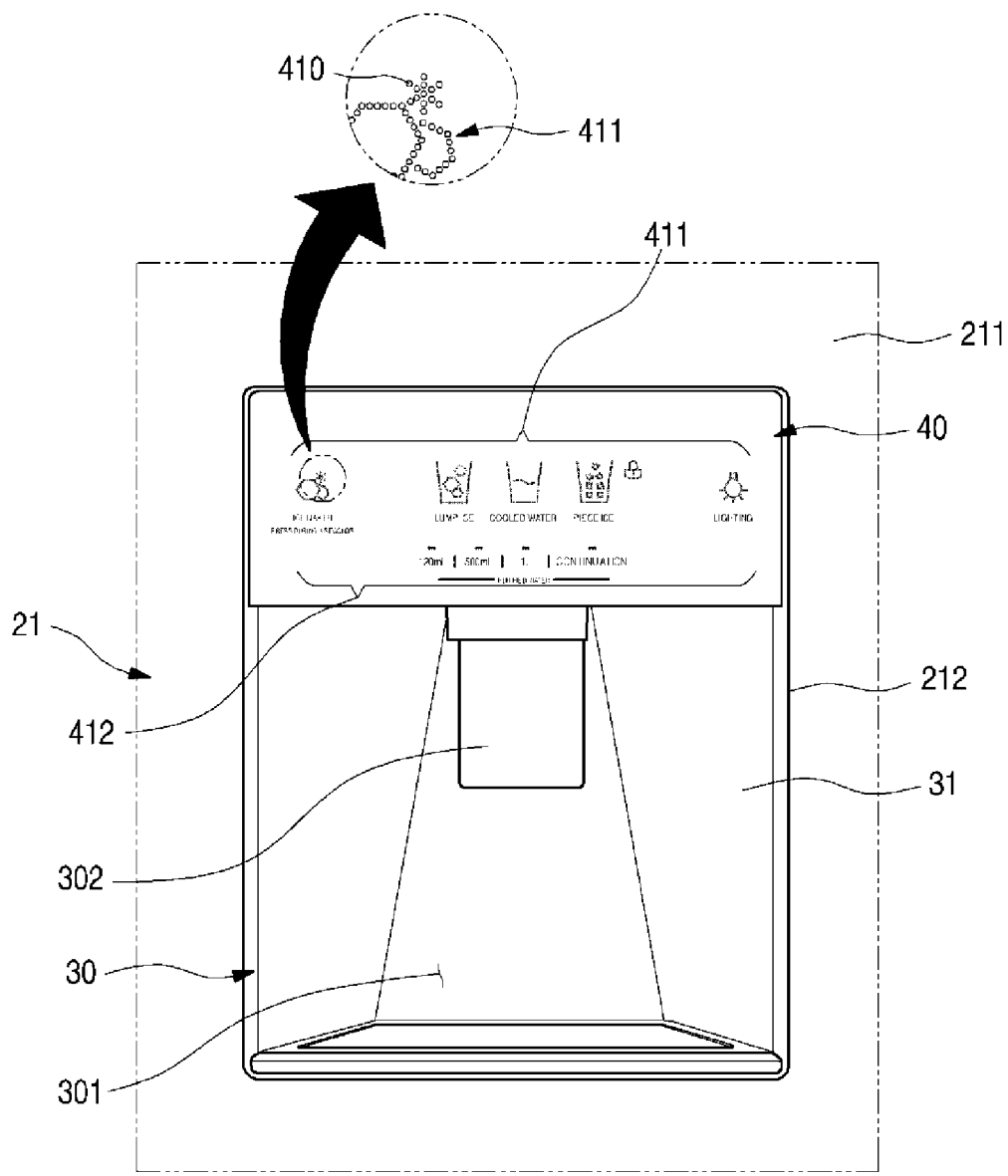
FIG. 2 is a front view of a dispenser according to the present disclosure.
Figure 3:
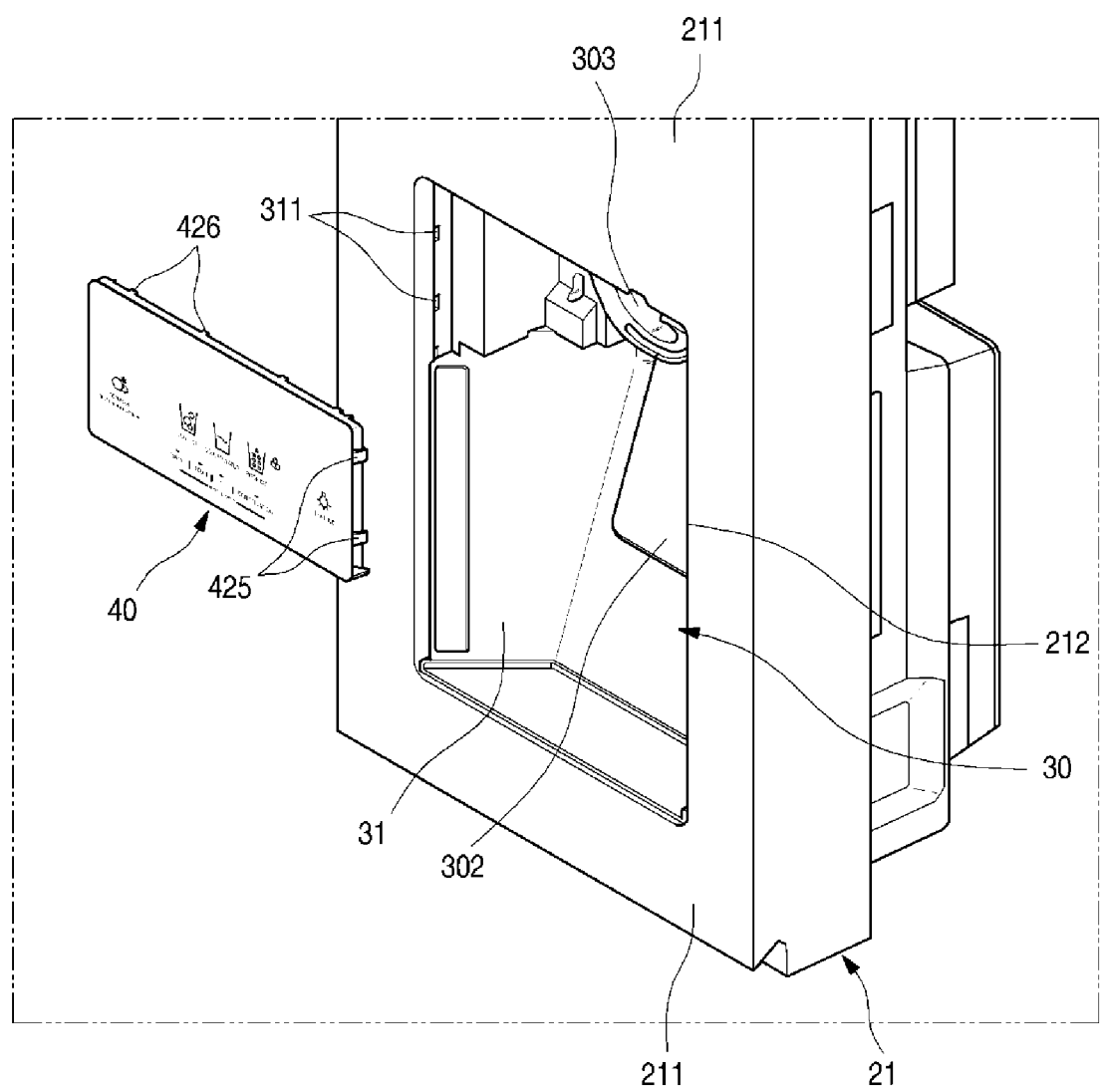
FIG. 3 is an exploded perspective view illustrating a mounting structure of a display assembly according to the present disclosure.
Figure 4:
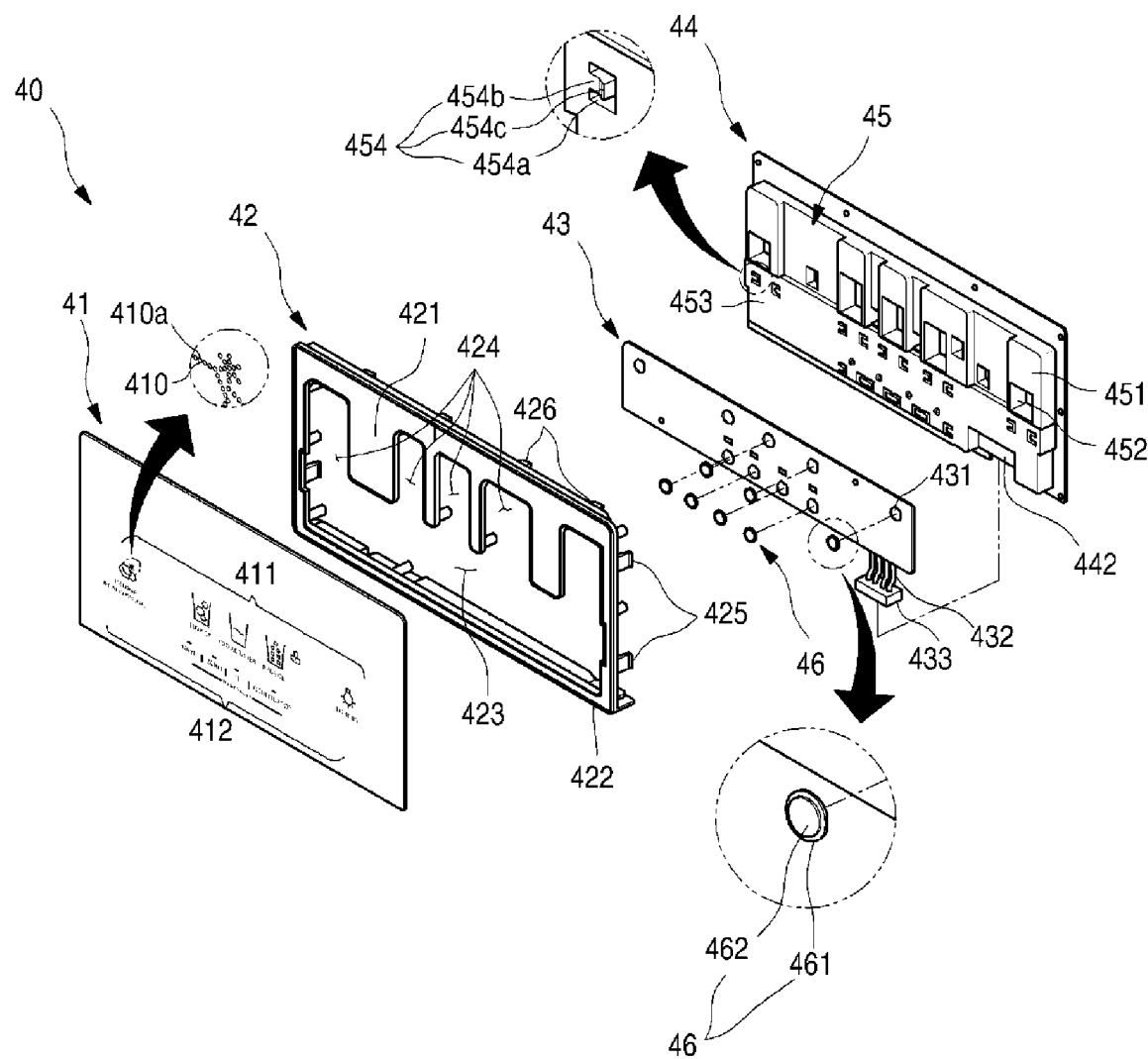
FIG. 4 is an exploded perspective view of the display assembly.
Figure 5:
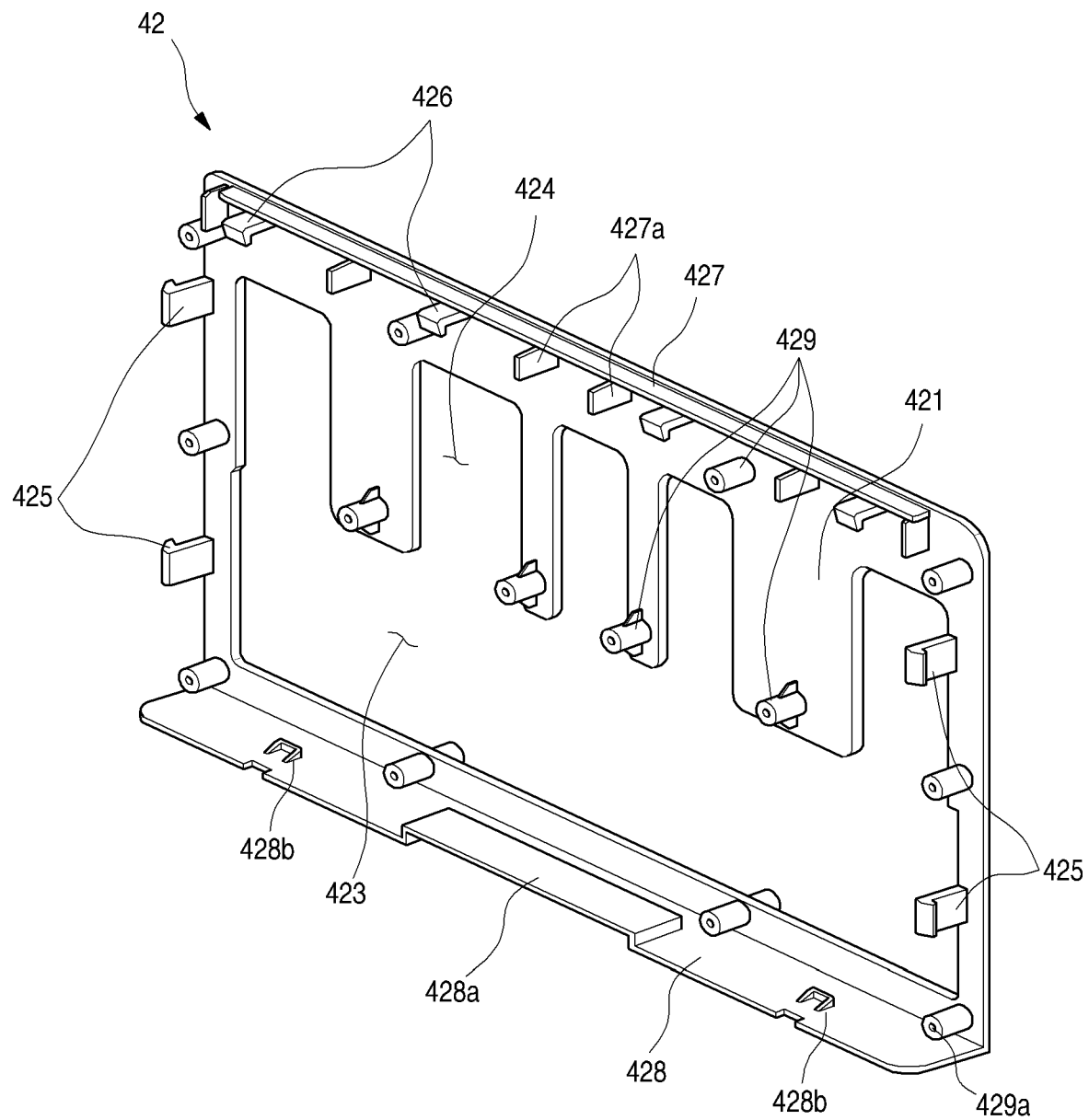
FIG. 5 is a perspective view of the display cover of the display assembly as viewed from a rear.
Figure 6:
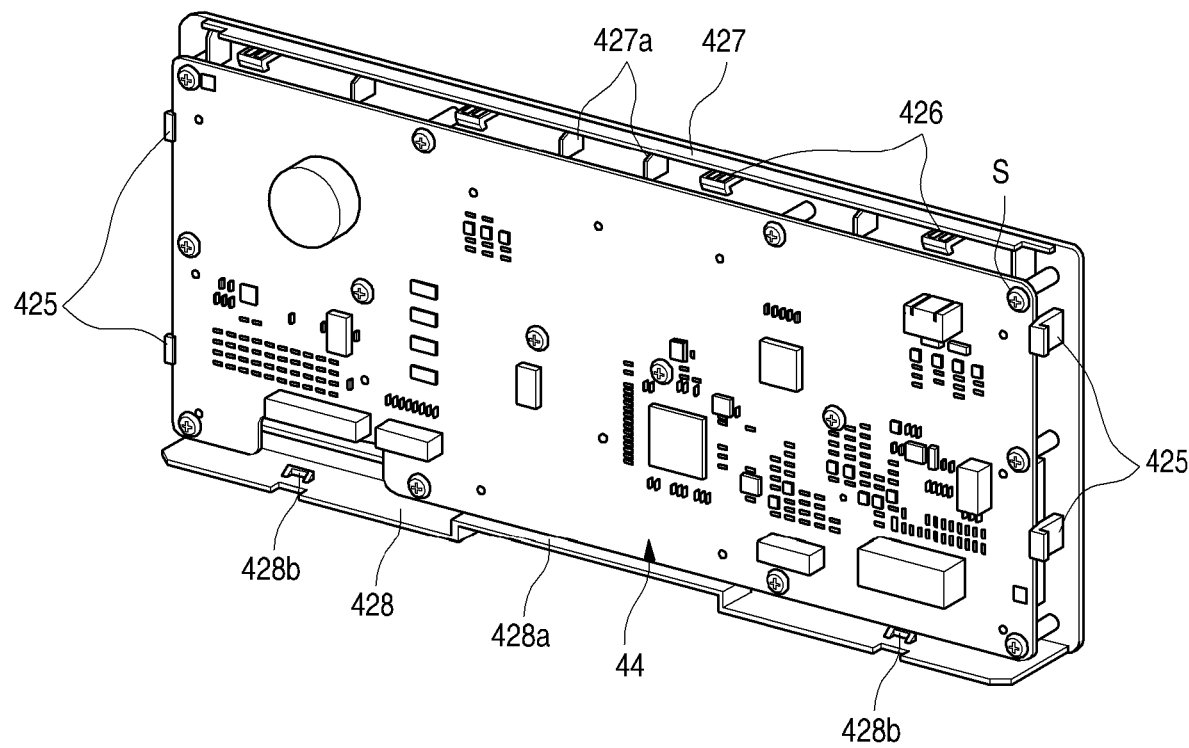
FIG. 6 is a perspective view of the display assembly as viewed from the rear.
Figure 7:
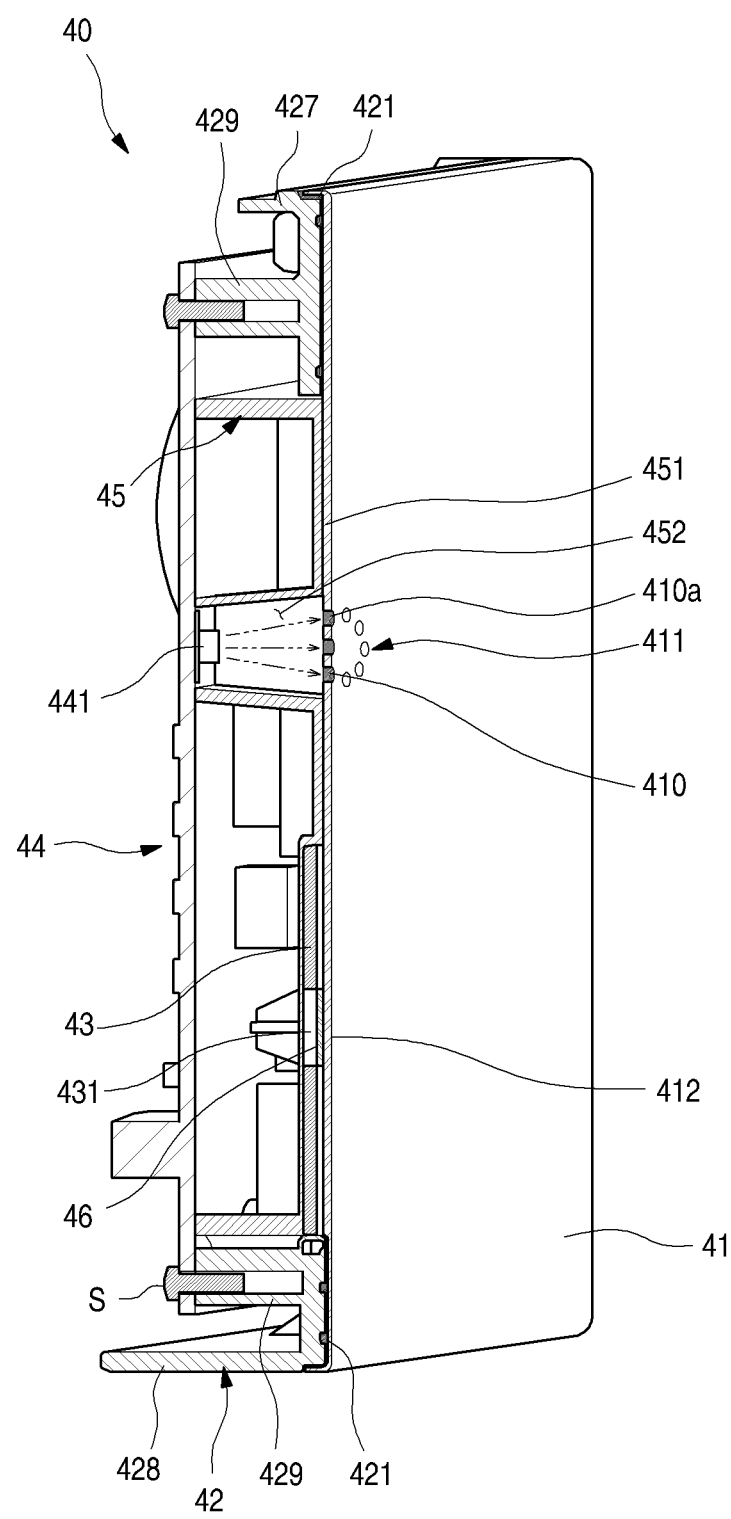
FIG. 7 is a cross-sectional view of the display assembly.

Referring to FIG. 2 and FIG. 3, a display assembly or display 40 may be provided on the front surface of the refrigerating chamber door 21. The front surface of the refrigerating chamber door 21 may be formed with a door panel or plate 211 made of a metal material, such as, e.g., stainless steel. The display 40 may be mounted in or at an opening 212 formed in the door panel 211.

The display 40 may include a dispenser case 31. The dispenser case 31 may be inserted into and mounted on an inside of the opening 212 and may form a space depressed toward an interior thereof, and thus, may form a space from which the water or ice may be dispensed. The lever 302 may be mounted on an inside surface of the dispenser case 31, and the port 303 may be provided above the lever 302.

A display 40 may be provided above the dispenser case 31. The display 40 may be mounted on an upper end of the dispenser case 31 and may be positioned on a same plane as the door panel 211 while mounted. For this, a front surface of the dispenser case 31 may be formed of a same stainless steel material as the door panel 211.

Mounting grooves 311 may be formed on both sides of the dispenser case 31 in a lateral direction. The mounting grooves 311 may be formed at positions corresponding to both ends of the display 40 and may be formed to be coupled to mounting protrusions 425 formed on the display 40.

The display 40 may shield or cover components in an upper end of the dispenser case 31, for example, the port 303, while mounted on the dispenser case 31. The display 40 may include a display portion 411 which may include a plurality of through-holes 410 and may display an activation state of the refrigerator 1 and an operation portion or operational interface 412 which may operate the refrigerator 1. The display portion 411 and the operation portion 412 represent a non-specific configuration in that the display portion 411 may define an area through which light may be transmitted and displays information and the operation portion 412 may define an area at which users may touch and operate the refrigerator 1.

Referring to FIG. 4 to FIG. 7, the display 40 may include a display plate 41, a display cover 42, a reflector 45, a touch printed circuit board (PCB) 43, and a display printed circuit board (PCB) 44. The display plate 41 may form an outer appearance of a front surface of the display 40 and may be formed of the same metal material as the door panel 211. The display 40 may have a sense of unity with the front surface of the refrigerating chamber door 21 when the display 40 is mounted. If a color or a pattern is formed on the door panel 211, the color or pattern may be also formed on a front surface of the display plate 41.

The display portion 411 and the operation portion 412 may be formed on the front surface of the display plate 41. The display portion 411 may display an activation state or an operation state of the refrigerator 1 and may be formed by a plurality of fine through-holes 410 that pass through the display plate 41. Each of the plurality of through-holes 410 may be formed to have a fine size of 0.2 to 0.3 mm as viewed from a front.

When light emitting devices (LEDs) 441 mounted on the display PCB 44 are off and when the refrigerating chamber door 21 side is viewed from a position spaced apart from the refrigerator 1, the plurality of through-holes 410 may not appear to be visible since a size thereof may be fine. In other words, the refrigerating chamber door 21 may appear as if the display portion 411 is not formed on the front surface thereof, and users may view the entire front surface of the display plate 41 as only a smooth stainless plate without another configuration or components.

The plurality of through-holes 410 may transmit or show information in the form of a specific character, symbol, or picture when the LEDs 441 are on, thereby forming the display portion 411. The plurality of through-holes 410 may be formed by etching a rear surface of the display plate 41. Each of the plurality of through-holes 410 may have a fine size, and therefore, if the through-hole is formed by laser machining, it may be difficult to form the through-hole with a uniform and fine size or thermal damage may occur.

If the plurality of through-holes 410 are etched from the front surface or both surfaces of the display plate 41, the front surface of the display plate 41 may be damaged. If the display plate 41 is damaged by etching, a color or texture of the display plate 41 may look different from that of the door panel 211, which may result in poor quality or consumer dissatisfaction. Therefore, in order to have a texture inherent or similar to stainless steel, the front surface of the display plate 41 may not be made with surface processing but the rear surface of the display plate 41 may be etched.

A hole filling member 410a may be formed on the rear surface of the display plate 41. The hole filling member 410a may be formed on a portion where the display portion 411 is formed along the rear surface of the display plate 41 and may be formed by various manners such as printing, coating, and sheet attaching. The hole filling member 410a may be formed of a material capable of transmitting light, such as, e.g., acrylic resin, and the hole filling member 410 may be formed in a printing or coating manner on an area of the display portion 411 to fill each of the plurality of through-holes 410. Therefore, foreign matter getting in the plurality of through-holes 410 may be prevented, thereby preventing the hole clogging or the poor light transmission.

The display portion 411 may be formed on an upper portion of the display PCB 44 and the operation portion 412 may be formed on a lower portion close to the display portion 411. The operation portion 412 may be formed at a position corresponding to a touch sensor 46 of the touch PCB 43. The operation portion 412 may include or utilize characters or graphics to indicate or represent an operation. In other words, characters or the touch area may be printed at a corresponding position where a user may touch the front surface of the display plate 41 at a position corresponding to the touch sensor 46. Since the touch sensor 46 is positioned directly below the display portion 411, a user may touch the position corresponding to the operation portion 412 without performing a separate print processing. In this case, only the display portion 411 may be viewed on the front surface of the display plate 41.

A display cover 42 may be provided on the rear surface of the display plate 41. A front surface of the display cover 42 may have a seating portion 421 on which the display plate 41 may be mounted. The seating portion 421 may be formed to have a same size and shape as the display plate 41. A sealant 422 may be applied to the seating portion 421, and the display plate 41 may be bonded to the front surface of the display cover 42 by the sealant 422. A periphery of the display plate 41 may be bent and the seating portion 421 may be accommodated therein. A periphery of the display cover 42 may be surrounded by the bent peripheral portion of the display plate 41. Therefore, when the display 40 is mounted on the dispenser 30, the display plate 41 and the door panel 211 may be in contact with each other to have a sense of unity.

A PCB guide portion 423 and a reflector guide portion 424 may be formed through the front surface of the display cover 42. The PCB guide portion 423 and the reflector guide portion 424 may be formed to communicate with each other.

For example, the PCB guide portion 423 may be formed at a position where the touch PCB 43 is mounted, that is, at a position corresponding to the operation portion 412. The PCB guide portion 423 may have a same size and shape as the touch PCB 43. Accordingly, when the touch PCB 43 is mounted on the PCB guide portion 423, the touch PCB 43 may be mounted at a position that matches the operation portion 412 of the display PCB 44. Since the touch sensor 46 of the touch PCB 43 may be positioned at the position of the operation portion 412 when the user touches the operation portion 412, the touch sensor 46 may sense the touch.

The reflector guide portion 424 may be at a position corresponding to the display portion 411 and may be formed so that the light guide portion 451 of the reflector 45 may be accommodated therein. The light guide portion 451 may be formed in a shape corresponding to the reflector guide portion 424 and may be inserted into an inside of the reflector guide portion 424.

A lower end of each of the reflector guide portions 424 may be connected to the PCB guide portion 423, and the reflectors 45 may be provided to be spaced apart from each other in a lateral direction. Light radiated from each of the light guide portions 451 may leak to a neighboring reflector guide portion 424, and thus, leakage of light through the plurality of through-holes 410 constituting the display portion at another position may be prevented.

Mounting protrusions 425 may be formed on both sides of the rear surface of the display cover 42. A plurality of mounting protrusions 425 may be provided, and each of the plurality of mounting protrusions 425 may be formed in a hook shape protruding outward and may be coupled with the mounting groove 311 when the display 40 is mounted.

A plurality of upper mounting protrusions 426 may be further formed along an upper end of the display cover 42. The upper mounting protrusion 426 may be formed in a hook shape protruding downward and inserted into an upper end of the dispenser case 31 to fixedly mount an upper end of the display 40 when the display 40 is mounted thereon.

An upper rib 427 extending rearward may be formed at the upper end of the display cover 42. The upper rib 427 may be in contact with the upper end of the dispenser case 31 to guide mounting of the display 40 and at the same time to not expose a gap at the upper end at which the dispenser case 31 and the display 40 are coupled to each other. A plurality of reinforcements 427a that support the upper ribs 427 from below may protrude from the rear surface of the display cover 42.

A lower rib 428 may be formed at the lower end of the display cover 42. The lower rib 428 may extend rearward and may be formed on an entire lower end of the display cover 42. The lower rib 428 may extend further rearward than the display PCB 44 and may shield or hide components of the dispenser 30 so that the components of the dispenser 30 may be hidden from view.

A stepped portion 428a protruding upward may be formed at a center of the lower rib 428. The stepped portion 428a may be formed to protrude so as to support a lower end of the display PCB 44. Latching portions or latches 428b may be formed at both sides of the stepped portion 428a. When the display 40 is mounted, the latches 428b may be latched to one side of the dispenser case 31 so that the display 40 may be further fixed.

A plurality of supporters 429 may be provided on the rear surface of the display cover 42. The plurality of supporters 429 may be formed between the light guide portions 451 as well as the periphery of the display cover 42 to support the display PCB 44 on which the reflector 45 is mounted. The supporters 429 may have a boss shape and may protrude at a predetermined height to support the display PCB 44. An extended end of each of the supporters 429 may include a screw hole 429a so that a screw S passing through the display PCB 44 may be fastened thereto.

The touch PCB 43 may be mounted on the PCB guide portion 423 of the cover display 42. The touch sensor 46 may be provided at a position corresponding to the operation portion 412 in the touch PCB 43. The touch sensor 46 may be a piezo sensor and may be formed by a ceramic element 462 attached to an upper surface of a metal plate 461.

The metal plate 461 may be elastically deformed according to a touch pressure of the display plate 41 by the user, and the ceramic element 462 may cause a change in an amount of electricity depending on the pressure. Although a shape of the touch sensor 46 may be circular, the shape of the touch sensor 46 is not limited to a circular shape, and may be formed in various shapes.

A plurality of touch sensors 46 may be formed along the touch PCB 43 and a sensor hole 431 may be formed in the touch PCB 43 on which the touch sensor 46 is mounted. The sensor hole 431 may be formed in the touch PCB 43 corresponding to the position where the touch sensor 46 is mounted and may be formed through the touch PCB 43.

The sensor hole 431 may be smaller in diameter than a size of the touch sensor 46 and a periphery of the sensor hole 431 may be formed to support a periphery of the touch sensor 46 or a periphery of the metal plate 461, from a lower side. The sensor hole 431 may be formed at a position corresponding to the operation portion 412 of the display plate 41 and may be larger than a size of the ceramic element 462 of the touch sensor 46. The touch sensor 46 may be mounted in a shape covering the sensor hole 431, and thus, the periphery of the sensor hole 431 may support the periphery of the metal plate 461 from the lower side and the ceramic element 462 may be not supported but be exposed to an inside of the sensor hole 431.

Due to such a structure, when the display plate 41 is displaced when the operation portion 412 is operated, displacement of the display plate 41 may be transmitted to the touch sensor 46 and since only the periphery of the metal plate 461 is supported, the touch sensor 46 may be elastically deformed more easily and the pressure generated when the operation portion 412 is touched may be concentrated on the ceramic element 462 so that the touch sensor 46 may effectively sense when the operation portion 412 is touched.

A connector cable 432 may be connected to one side of the touch PCB 43, and a PCB connector 433 may be provided at an end portion of the connector cable 432. Power and signals may be transmitted and received by connecting the PCB connector 433 to a connector portion 442 of the display PCB 44 after mounting the touch PCB 43 and the display PCB 44, respectively.

The display PCB 44 may be coupled to the rear surface of the display cover 42. The display PCB 44 may be formed to be slightly smaller than the display cover 42 and may be configured to be coupled by the supporters 429. The display PCB 44 mounted on the supporters 429 may be close to the display plate 41 attached to the front surface of the display cover 42.

A plurality of LEDs 441 may be mounted on the front surface of the display PCB 44. The LEDs 441 may be positioned inside the light guide portion 451 of the reflector 45, and light may be radiated to the outside through the display portion 411 when the LED 441 is on.

A reflector 45 may be provided on the front surface of the display PCB 44. The reflector 45 may be formed to have a predetermined thickness so as to guide the light emitted from the LED 441 toward the display portion and to support the touch PCB 43 at the same time. The reflector 45 may be provided with a light guide portion 451. The light guide portion 451 may protrude to have a predetermined height and may be formed to protrude further than a peripheral portion of the reflector 45, and a protruding height of the light guide portion 451 may be formed to correspond to a height of the reflector guide portion 424, and thus, a front surface of the light guide portion 451 may be completely in contact with the display plate 41. The light guide portion 451 may be formed in a shape corresponding to a shape of the reflector guide portion 424 and may be inserted into and coupled with the reflector guide portion 424.

A lighting part 452 may be opened on the front surface of the light guide portion 451. The lighting part 452 may be depressed at a position corresponding to the position of the LED 441 mounted on the display PCB 44 and may be recessed to the display PCB 44 so that the LED 441 may be exposed. When the display PCB 44 is mounted, the display plate 41 may be in close contact with the front surface of the light guide portion 451 to shield the lighting part 452. The display portion 411 of the display PCB 44 may be positioned inside the opened region of the lighting part 452. Thus, light guided through the lighting part 452 when the LED 441 is on may not leak to a periphery due to the light guide portion 451 but may be radiated by fully passing through the through-holes 410 of the display portion 411.

A plurality of the light guide portions 451 may be formed at positions corresponding to the display portion 411, and the plurality of the light guide portions 451 may be provided to be spaced apart from each other. A PCB support portion 453 may be formed below the light guide portion 451. The PCB support portion 453 may support the touch PCB 43 from behind, and the touch PCB 43 may be in close contact with the rear surface of the display plate 41.

The PCB support portion 453 may have a size corresponding to the touch PCB 43, and an elastic support portion 454 may be formed on the front surface of the PCB support portion 453 to press and support the touch PCB 43. A plurality of elastic supporting portions 454 may be formed and may be provided in a number corresponding to positions of the touch sensors 46 so that the touch sensors 46 may further contact with the rear surface of the display PCB 44, and thus, recognition rate of the touch sensors 46 may be increased.

For example, the elastic supporting portion 454 may include a cutout portion 454a, which may be formed by cutting a portion of the PCB support portion 453, and an elastic portion 454b, which may be formed by the cutout portion 454a. In other words, the cutout portion 454a may be formed along a periphery excluding one side, which may include the elastic portion 454b. A contact or protrusion portion 454c may protrude from an end of the elastic portion 454b, and the contact portion 454c may protrude from a position corresponding to a center portion of the touch sensor 46.

Accordingly, when the user touches and operates the operation portion 412, pressure may be transmitted to the touch sensor 46. On the rear surface of the touch PCB 43, the elastic supporting portion 454 may press or hold the touch PCB 43 to a front side so that a touch may be more clearly recognized.

The connector portion 442, which may be connected to the PCB connector 433, may be formed at a lower end of the PCB support portion 453. The connector portion 442 may be provided at a lower end of the reflector 45 and may be formed in a depressed space of the reflector 45 to provide a connection space with the PCB connector 433.

Figure 8:
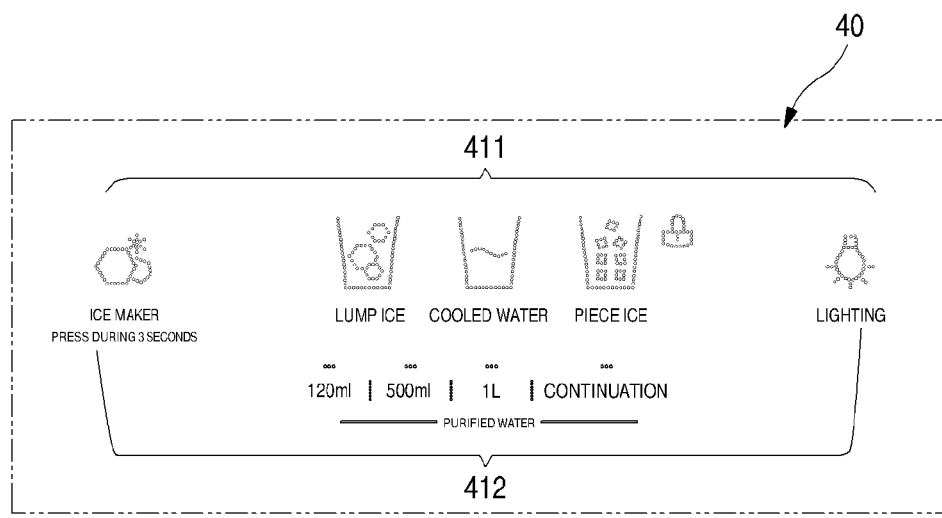
FIG. 8 is a view illustrating a state before operation of the display assembly.

Referring to FIG. 8, when the refrigerator 1 is not operated, the display portion 411 of the display 40 may be off. Since the display portion 411 is off, only the plurality of through-holes 410 are exposed to the outside. As the through holes 410 are spaced apart from the display portion 411 by a predetermined distance and the through-holes 410 may not be clearly seen, the front surface of the display 40 may be seen as a plate shape integrated with the front surface of the outer plate 211.

Depending on a setting, even before the operation portion 412 is operated, a temperature of the refrigerating chamber 11 or the freezing chamber 12 may be displayed or a previous selection on the display portion 411 may be on or displayed. Light may be radiated through the through-holes 410 constituting the corresponding display portion 411 to display corresponding information.

Figure 9:
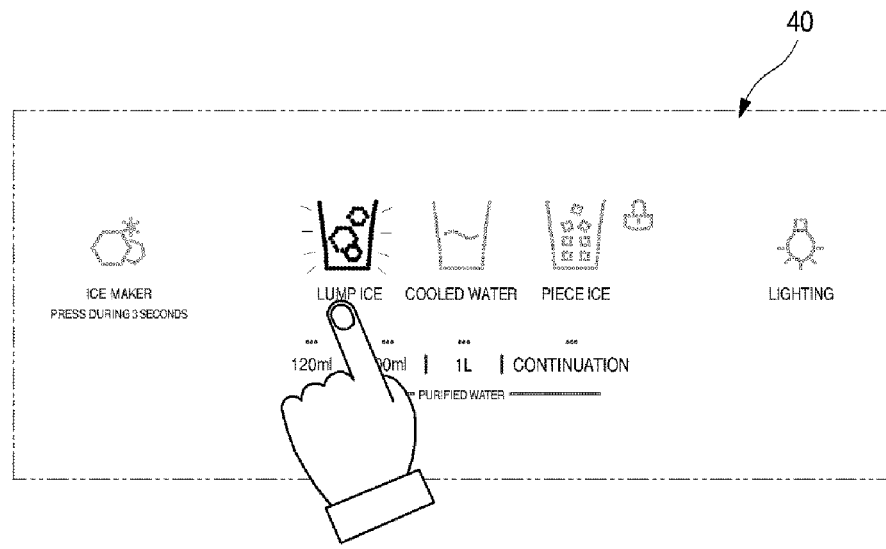
FIG. 9 is a view illustrating an operation state of the display assembly.

Referring to FIG. 9, when a user operates the operation portion 412 to activate the refrigerator 1, the corresponding display portion 411 may be on. For example, if the user wishes to get cool water through the dispenser 30, the user may touch the operation portion 412 that displays cool water via a symbol or icon. A pressure change may be generated in the display plate 41 by the touch on or at the operation portion 412, and the touch sensor 46, which is in close contact with the display plate 41, may sense the pressure change. The touch sensor 46 may be seated in the sensor hole 431, and the touch sensor 46 may sense the touch operation of the operation portion 412.

According to the signal sensed by the touch sensor 46, the LED 441 in the corresponding position may be on. Light radiated from the LED 441 may be radiated to a corresponding area of the display portion 411 through the lighting part 452 of the light guide portion 451, which is in close contact with the display plate 41. Therefore, the light may pass or shine through the through-holes 410 constituting the display portion 411 corresponding to the cool water, and the user may confirm from the outside that the display portion 411 indicating the cool water is on.

The display portion 411 indicating or representing the cool water may be on at a position very close to the operation portion 412. The user may confirm an accurate operation state, and information selected in an entire area of the refrigerating chamber door 21 may be displayed. Then, the user may operate the lever 302 inside the dispenser case 31 and get cool water from the port 303 by operating the lever 302.

Embodiments disclosed herein provide a refrigerator and a display for the refrigerator in which a display capable of displaying information by touch may be mounted on one side of a dispenser using a simple structure. Embodiments disclosed herein also provide a refrigerator and a display for the refrigerator having improved productivity and assembly ability. Embodiments disclosed herein further provide a refrigerator and a display for the refrigerator in which information recognition by a user may be clear and easy, and operations selected by the user may be accurately performed. Embodiments disclosed herein also provide a display for a refrigerator that may minimize defects during assembly and use thereof.

According to embodiments disclosed herein, a refrigerator may include a door that opens and closes a storage space, a door panel that forms an outer appearance of the door and is made of a metal material, a dispenser provided on the door and mounted on the door panel, and a display mounted on one side of the dispenser that displays an activation state of the refrigerator and configured to receive a touch input so as to activate an operation of the refrigerator. The display may include a display plate formed of a same metal material as the door panel to form an outer appearance of a front surface of the display, the display plate having a display portion including a plurality of fine through-holes to display the activation state and an operation portion operated by the touch input, a touch printed circuit board (PCB) provided on a rear surface of the display plate and including a plurality of touch sensors provided at positions corresponding to the operation portion, a display PCB on which a light emitting device (LED) that radiates light toward the plurality of through-holes of the display portion is mounted, and a display cover in close contact with the rear surface of the display plate and on which the touch PCB and the display PCB are mounted.

The door panel may include an opening on which the display is mounted, and the display may be mounted so as to cover at least a portion of the opening. The display may be provided in the depressed space of the dispenser and include a dispenser case in which a take-out port or port that dispenses water or ice and a take-out member or lever that operates the dispenser are installed, and the display may cover the port by being mounted on an upper end of the dispenser case.

Mounting protrusions coupled to mounting grooves formed in the dispenser case may be formed at both ends of the display cover. The display plate may be formed to have a same texture as the door panel, and the display plate and the door panel may be provided on a same plane when the display is mounted.

According to embodiments disclosed herein, a display for a refrigerator may include a display plate defining an outer appearance of a front surface of the display, a plurality of display portions that displays information of the refrigerator and is formed by an arrangement of a plurality of fine through-holes that pass through the display plate, a plurality of operational interfaces formed on a front surface of the display plate and operated by a touch input, a touch PCB provided on a rear surface of the display plate and including a plurality of touch sensors at positions corresponding to the plurality of operational interfaces, a display PCB on which a LED that radiates light toward the plurality of fine through-holes is mounted, and a display cover provided close to the rear surface of the display plate and on which the touch PCB and the display PCB are mounted.

The through-holes may be formed on a rear surface of the display plate by etching. A reflector may be formed on a front surface of the display PCB, which is in close contact with the rear surface of the display plate, and may guide the light of the LED to be independently radiated to the plurality of display portions. The reflector may include a light guide portion on which a lighting part, opened at a position corresponding to the LED, is formed and which protrudes toward the display plate, and a PCB support portion on which the touch PCB is seated and by which the touch PCB is in close contact with the display plate side.

An elastic support portion may be further formed in the PCB support portion which is formed at a position corresponding to the touch sensor and presses the touch PCB to the display plate. The elastic support portion may include an elastic portion which is formed at a position corresponding to the touch sensor, a cutout portion which is formed by cutting a portion of the reflector around the elastic portion, and a protrusion portion which protrudes from a side of the elastic portion corresponding to the center of the touch sensor to the touch PCB side.

The display cover may include a reflector guide portion which is opened in a shape corresponding to the light guide portion and into which the light guide portion is inserted, and a PCB guide portion which is opened in a shape corresponding to the touch PCB and into which the touch PCB is inserted. The reflector guide portion and the PCB guide portion may be opened to communicate with each other.

A seating portion having a size corresponding to that of the display plate may be formed in the display cover, and the display plate may be bent to surround the periphery of the seating portion. A plurality of supporters which support the display PCB in a state of being spaced apart from each other may extend from the rear surface of the display cover. A screw hole, which is passed through the display PCB and is fastened thereto, may be formed on an end portion of the supporter.

A fastening or mounting protrusion having a hook shape may be formed on a periphery of the rear surface of the display cover. The touch PCB and the display PCB may be respectively provided in a separated state from each other and may be connected to each other by a connector transferring power and signal.

A sensor hole may be formed on the touch PCB which has a size smaller than a size of a periphery of the touch sensor at a position corresponding to the touch sensor. The touch sensor may be a piezo sensor, and the touch sensor may include a metal plate having a size larger than that of the sensor hole, and a ceramic element which is formed to a size smaller than that of the sensor hole and is attached to one surface of the metal plate which is in contact with the display plate.

Since the display plate forming the front surface of the display may be formed of the same material as the door panel constituting the door, the front surface of the display and the front surface of the door may have a sense of unity and an improved appearance.

Since the display portion of the display may be formed with fine through-holes, the display portion may be visible when the LED is on, and the display portion may not be visible when the LED is off, outer appearances of the display and doors may have a better sense of unity. Since the through-holes are formed by etching the rear surface of the display plate and damage to the front surface of the display plate may be prevented, outer appearances of the door panel of the door and the front surface of the display plate may match each other.

In the display, the display portion and the LEDs may be aligned to each other, the operation portion and the touch PCB may be aligned to each other by the lighting guide portion, and the touch PCB may be mounted in a correct position by the display cover. Thus, more clear lighting of the display portion and improved operability of the operation portion may be expected.

The display portion and the operation portion may be positioned at a very close position to each other by the reflector guide portion of the display cover and the PCB guide portion communicating with each other, and thus operability and recognition performance may be improved. Recognition sensitivity of the touch sensor may be improved by an elastic support portion being formed on the PCB support portion to be in close contact with the touch PCB and the display plate and to be in close contact with the touch sensor and the operation portion.

Any reference in this specification to "one embodiment," "an embodiment," "example embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments may be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A refrigerator, comprising: a door that opens and closes a storage space; a door panel that forms an outer appearance of the door; a dispenser provided on the door and mounted to the door panel; and a display mounted on one side of the dispenser that displays an activation state of the refrigerator and configured to receive a touch input so as to activate an operation of the refrigerator, wherein the display includes: a display plate formed of a metal material to form an outer appearance of a front surface of the display, the display plate having a display portion including a plurality of fine through-holes to display the activation state and an operation portion operated by the touch input; a display printed circuit board (PCB) on which a light emitting device (LED) that radiates light toward the plurality of through-holes of the display portion is mounted; a reflector provided on a surface of the display PCB that faces the display plate; a touch printed circuit board (PCB) provided between the reflector and the display plate and including a plurality of touch sensors provided at positions corresponding to the operating portion; and a display cover provided on a rear surface of the display plate; the display cover having an opening through which the reflector and the touch PCB pass; wherein the display PCB is mounted on a rear side of the reflector and the touch PCB is mounted on a front side of the reflector relative to the display plate, and wherein the reflector comprises: a light guide portion that protrudes from a front surface of the reflector to contact the rear surface of the display plate, the light guide portion being configured to guide light from the LED to the plurality of display portions and having a lighting part which is opened at a position corresponding to the LED; a PCB support portion formed on the front side of the reflector, the PCB support portion being configured to support a rear side of the touch PCB so that the touch PCB contacts the display plate; and an elastic support portion that protrudes from the PCB support portion corresponding to the positions of the touch sensors and configured to press the touch PCB so that the plurality of touch sensors contact the rear surface of the display plate.

2. The refrigerator according to claim 1, wherein the door panel includes an opening at which the display is mounted, and
wherein the display is mounted so as to cover at least a portion of the opening.

3. The refrigerator according to claim 1, wherein the display is provided in a depressed space of the dispenser and the dispenser includes a dispenser case having a port that dispenses water or ice and a lever that operates the dispenser to dispense water or ice, and
wherein the display covers the port by being mounted on an upper end of the dispenser case.

4. The refrigerator according to claim 3, wherein a plurality of mounting protrusions are formed at both ends of the display cover and are coupled to a plurality of mounting grooves formed in the dispenser case.

5. The refrigerator according to claim 1, wherein the display plate has a same texture as the door panel, and
wherein the display plate and the door panel are provided on a same plane when the display is mounted.

6. A display for a refrigerator, comprising: a display plate defining an outer appearance of a front surface of the display; a plurality of display portions that displays information of the refrigerator and is formed by an arrangement of a plurality of fine through-holes that pass through the display plate; a plurality of operational interfaces formed on a front surface of the display plate and operated by a touch input; a display printed circuit board (PCBI on which a light emitting device (LED) that radiates light toward the plurality of fine through-holes is mounted; a reflector provided on a surface of the display PCB that faces the display plate; a touch printed circuit board (PCB) provided between the reflector and the display plate and including a plurality of touch sensors provided at positions corresponding to the plurality of operational interfaces; and a display cover provided on a rear surface of the display plate, the display cover having an opening through which the reflector and the touch PCB pass, wherein the display PCB is mounted on a rear side of the reflector and the touch PCB is mounted on a front side of the reflector relative to the display plate, and wherein the reflector comprises: a light guide portion that protrudes from a front surface of the reflector to contact the rear surface of the display plate, the light guide portion being configured to guide light from the LED to the plurality of display portions and having a lighting part which is opened at a position corresponding to the LED; a PCB support portion formed on the front side of the reflector, the PCB support portion configured to support a rear side of the touch PCB so that the touch PCB contacts the display plate; and an elastic support portion that protrudes from the PCB support portion corresponding to the positions of the touch sensors and configured to press the touch PCB so that the plurality of touch sensors contact the rear surface of the display plate.

7. The display according to claim 6, wherein the plurality of fine through-holes is formed on the display plate.

8. The display according to claim 6, wherein the light guide portion protrudes further toward the display plate than the PCB support portion.

9. The display according to claim 6, wherein the PCB support portion has a size corresponding to a size of the touch PCB.

10. The display according to claim 6, wherein the elastic support portion is located at a position corresponding to the plurality of touch sensors.

11. The display according to claim 6, wherein the elastic support portion includes:
an elastic portion formed at a position corresponding to one touch sensor of the plurality of touch sensors,
a cutout portion formed by cutting a portion of the reflector around the elastic portion, and
a protrusion portion that protrudes from a side of the elastic portion corresponding to a center of the touch sensor towards the touch PCB.

12. The display according to claim 6, wherein the opening of the display cover includes:
- a reflector guide portion opened in a shape corresponding to the light guide portion and into which the light guide portion is inserted, and
- a PCB guide portion opened in a shape corresponding to the touch PCB and into which the touch PCB is inserted.

13. The display according to claim 12, wherein the reflector guide portion and the PCB guide portion are opened to communicate with each other.

14. The display according to claim 6, wherein a seating portion having a size corresponding to a size of the display plate is formed in the display cover, and
- wherein the display plate is bent to surround a periphery of the seating portion.

15. The display according to claim 14, wherein a plurality of supporters that supports the display PCB while spaced apart from each other extends from the rear surface of the display cover.

16. The display according to claim 15, wherein a screw hole is formed on an end portion of each of the plurality of supporters, the screw hole being a space in which a screw is inserted to fasten the display cover to the display PCB.

17. The display according to claim 14, wherein at least one mounting protrusion having a hook shape is formed around a periphery of the rear surface of the display cover.

18. The display according to claim 6, wherein the touch PCB and the display PCB are provided separate from each other and are connected to each other by a connector that transmits power and signals.

19. The display according to claim 6, wherein a sensor hole is formed on the touch PCB, the sensor hole having a size smaller than a size of a periphery of one touch sensor of the plurality of touch sensors at a position corresponding to the touch sensor.

20. The display according to claim 19, wherein at least one touch sensor of the plurality of touch sensors is a piezo sensor, and wherein the at least one touch sensor includes:
- a metal plate having a size larger than the size of the sensor hole, and
- a ceramic element having a size smaller than the size of the sensor hole and attached to a surface of the metal plate that contacts the display plate.

* * * * *